(12) United States Patent
Doyle et al.

(10) Patent No.: US 7,834,625 B2
(45) Date of Patent: Nov. 16, 2010

(54) SPLIT-ECHO WITH FRACTIONAL TEMPORAL-INTERPOLATION

(75) Inventors: Mark Doyle, Wexford, PA (US); Robert Biederman, Wexford, PA (US)

(73) Assignee: Allegheny-Singer Research Institute, Pittsburgh, PA (US)

( * ) Notice: Subject to any disclaimer, the term of this patent is extended or adjusted under 35 U.S.C. 154(b) by 338 days.

(21) Appl. No.: 12/006,540

(22) Filed: Jan. 3, 2008

(65) Prior Publication Data

US 2009/0174404 A1    Jul. 9, 2009

(51) Int. Cl.
*G01V 3/00* (2006.01)
(52) U.S. Cl. .................................. 324/309; 324/307
(58) Field of Classification Search .............. 324/309, 324/307
See application file for complete search history.

(56) References Cited

U.S. PATENT DOCUMENTS 4,973,906 A * 11/1990 Bernstein .................... 324/309
5,034,692 A * 7/1991 Laub et al. .................. 324/309
5,160,889 A   11/1992 Scheidegger et al.
6,794,867 B1 * 9/2004 Block et al. ................. 324/307
7,020,509 B2 * 3/2006 Heid .......................... 600/410

OTHER PUBLICATIONS

S.E. Maier, M.B. Scheidegger, K. Liu, P. Boesiger, "Accurate Velocity Mapping With FAcE," Magnetic Resonance Imaging, Elsevier Science, Inc. (USA), vol. 14 (No. 2), p. 163-171, (1996).

* cited by examiner

*Primary Examiner*—Louis M Arana
(74) *Attorney, Agent, or Firm*—Pepper Hamilton LLP

(57) ABSTRACT

An MRI to form an image of a patient includes at least one emitting coil which produces RF pulses and gradients. The MRI includes a controller in communication with the emitting coil for obtaining a steady-state image of the patient, where gradient areas balance to zero for each time repetition (TR) interval, and for causing the emitting coil to produce the RF pulses without interruption during the time repetition interval. The MRI includes at least one receiving coil in communication with the controller which receives the RF pulses and provides the RF pulses to the controller for the controller to obtain the image. A method to form an image of a patient with an MRI. A computer program embodied on a computer readable medium to form an image of a patient with an MRI.

23 Claims, 10 Drawing Sheets

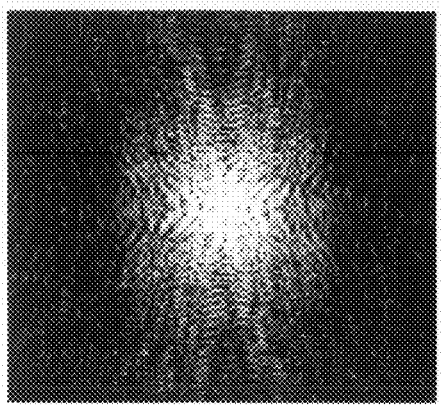
FIG. 1A
PRIOR ART
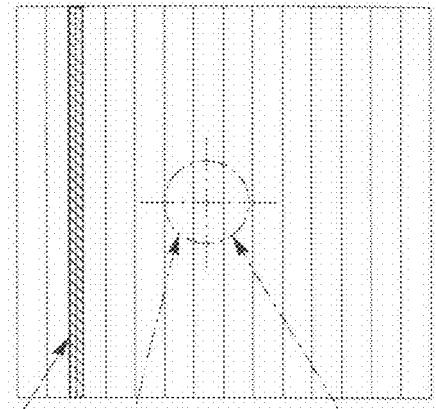
FIG. 1B
PRIOR ART
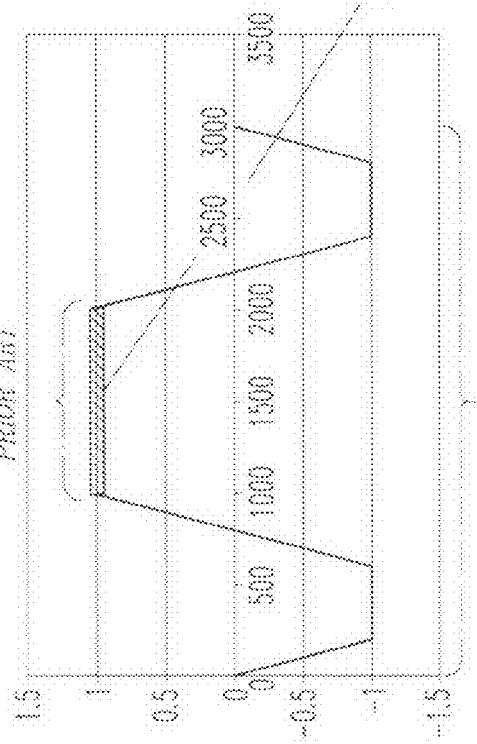
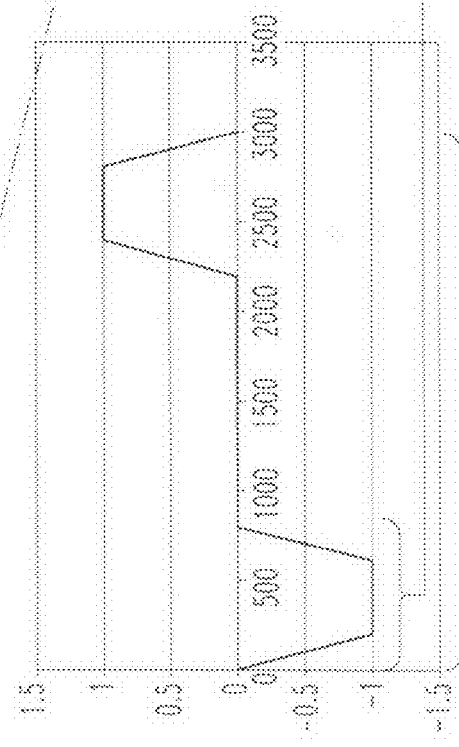

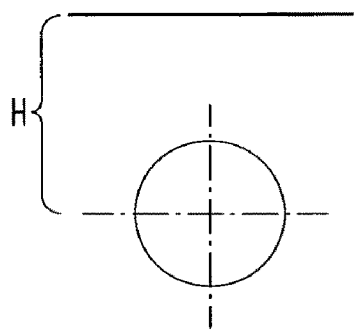
*FIG.6A*
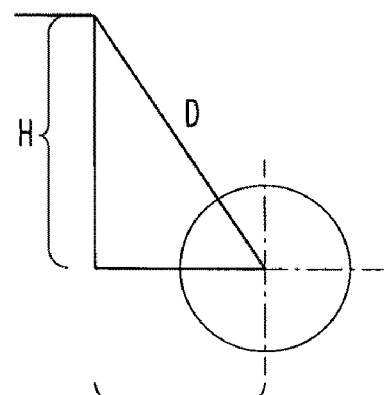
*FIG.6B*
| EARLY | MIDDLE | LATE |
|---|---|---|
| 7.7 | 7.5 | 7.7 |
| 6.8 | 5.5 | 6.8 |
| 5.9 | 5.6 | 5.9 |
| 5.1 | 4.7 | 5.1 |
| 4.3 | 3.8 | 4.3 |
| 3.5 | 2.8 | 3.5 |
| 3 | 1.9 | 3 |
| 1 | 1 | 1 |
| 1 | 1 | 1 |
| 3 | 1.9 | 3 |
| 3.5 | 2.8 | 3.5 |
| 4.3 | 3.8 | 4.3 |
| 5.1 | 4.7 | 5.1 |
| 5.9 | 5.6 | 5.9 |
| 6.8 | 6.5 | 6.8 |
| 7.7 | 7.5 | 7.7 |
*FIG.7*

US 7,834,625 B2

SPLIT-ECHO WITH FRACTIONAL TEMPORAL-INTERPOLATION

FIELD OF THE INVENTION

The present invention is related to an MRI to form an image of a patient where gradient areas balance to zero for each time repetition (TR) interval, and an emitting coil produces RF pulses without interruption during the time repetition interval. More specifically, the present invention is related to an MRI to form an image of a patient where gradient areas balance to zero for each time repetition (TR) interval, an emitting coil produces RF pulses without interruption during the time repetition interval and a controller causes the gradients to target specific regions in K space during each TR interval, where at least two of the regions overlap in K space and at least one region of K space is not imaged with the gradients during a given TR interval.

BACKGROUND OF THE INVENTION

In MRI, SSFP imaging is widely used since it is a signal rich sequence that provides excellent contrast to noise ratio (CNR) images, especially for cardiac imaging. Typically, this sequence is applied using a matrix of moderately high resolution, e.g. 256×256. Irrespective of the gradients available to the imaging system, the limiting factor of SSFP imaging is TR, since the sequence relies on precise control of the phase of the spin system, when a long TR is used inhomogeneities in the main magnetic field ($B_0$) are responsible for partially dephasing the spin system, causing severe phase errors to be present in the image. These phase errors associated with an excessively long TR manifest as distinct bands of signal loss referred to as phase roll artifacts. Conventionally, the imaging gradients used in an SSFP sequence are applied at their maximal strength and maximum switching rate to ensure a low TR, FIG. 1. FIGS. 1a and 1b show measurement and phase encoding gradient conditions for steady state free precession (SSFP) imaging. Represented is the echo forming measurement gradient (top left) and the phase encoding gradient (lower left). A representative k-space signal (FIG. 1b) is shown and the manner in which k-space data are compiled one line at a time is shown (lower right). As indicated by the sold lines, the initial gradient lobe of the phase encoding gradient is responsible for advancing the signal "vertically" along the k-space matrix, while the measurement gradient forms an echo signal where data is read-out "horizontally" (indicated by thick gray line) to form one line of k-space. Also indicated by dashed lines is the aspect that the area of all gradients must sum to zero at the end of the sequence, to restore the phase of the spin system to zero (corresponding to the center of k-space). Successive lines of k-space are acquired by repeating the gradient sequence, but with the phase encoding gradient applied at different amplitudes corresponding to each separate line. When higher matrix scans are performed, increasing the gradient strength is not feasible, and thus the gradient duration increases, thereby increasing the minimal TR. Thus, while the excellent CNR of SSFP imaging will accommodate scans with higher matrices, e.g. matrix increased by 50% to 384×384, doing so typically results in increasing the TR of the sequence. In the increased TR scan the risk of phase roll artifacts obscuring a region of interest typically make these scans unreliable and they are rarely used. For instance, increasing the TR from 4 ms to 5 ms typically results in a dramatic increase in artifact level, which is particularly problematic when the artifact falls over a region of rapidly flowing blood, since this can generate an artifact band, obliterating surrounding image features.

BRIEF SUMMARY OF THE INVENTION

The present invention pertains to an MRI to form an image of a patient. The MRI comprises at least one emitting coil which produces RF pulses and gradients. The MRI comprises a controller in communication with the emitting coil for obtaining a steady-state image of the patient, where gradient areas balance to zero for each time repetition (TR) interval, and for causing the emitting coil to produce the RF pulses without interruption during the time repetition interval. The MRI comprises at least one receiving coil in communication with the controller which receives the RF pulses and provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

A computer program embodied on a computer readable medium to form an image of a patient with an MRI comprising the computer generated steps of producing RF pulses and gradients with at least one emitting coil. There is the step of obtaining a steady-state image of the patient with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The invention involves splitting up the acquisition of the echo signal in a steady-state free precession (SSFP) magnetic resonance imaging (MRI) scan into three segments, such that the minimum repetition time (TR) of the MRI sequence is reduced compared to the conventional approach of reading out the complete echo signal in a single TR period. When applied to image static structures, the scan time is doubled compared with a conventional scan. When applied to image dynamic structures (such as the heart) the scan time is maintained by use of the temporally sparse data-sampling scheme, MACH, described in U.S. patent application Ser. No. 11/786, 685, titled "Rapid MRI Dynamic Imaging Using Mach," incorporated by reference herein.

The present invention pertains to an MRI to form an image of a patient. The MRI comprises at least one emitting coil which produces RF pulses and gradients. The MRI comprises a controller in communication with the emitting coil for obtaining a steady-state image of the patient's accelerating tissue, where gradient areas balance to zero for each time repetition (TR) interval, and for causing the emitting coil to produce the RF pulses without interruption during the time repetition interval. The MRI comprises at least one receiving coil in communication with the controller which receives the RF pulses and provides the RF pulses to the controller for the controller to obtain the image.

The present invention pertains to an MRI to form an image of a patient. The MRI comprises at least one emitting coil which produces RF pulses and gradients disposed in the structure. The MRI comprises a controller in communication with the emitting coil for obtaining a steady-state image of the patient's fat and liquid features by altering the fat and liquid spin phases to produce contrast, where gradient areas balance to zero for each time repetition (TR) interval, and for causing the emitting coil to produce the RF pulses without interruption during the time repetition interval. The MRI comprises at least one receiving coil disposed in the structure in communication with the controller which receives the RF pulses and provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's heart with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's short T2 tissue with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's tissue in proximity to an implant with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's accelerating tissue with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's fat and liquid features by altering the fat and liquid spin phases to produce contrast with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's heart with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's short T2 tissue with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's tissue in proximity to an implant with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's accelerating tissue with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's fat and liquid features by altering the fat and liquid spin phases to produce contrast with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

BRIEF DESCRIPTION OF THE SEVERAL VIEWS OF THE DRAWING

In the accompanying drawings, the preferred embodiment of the invention and preferred methods of practicing the invention are illustrated in which:

FIGS. 1a and 1b show measurement and phase encoding gradient conditions for steady state free precession (SSFP) imaging.

FIGS. 6a and 6b show the principle of how MACH sparse sampling factors are selected.

FIG. 7 shows the sparse sampling rates for the MACH sampling scheme used in SWIFT.

DETAILED DESCRIPTION OF THE INVENTION

Figure 11:
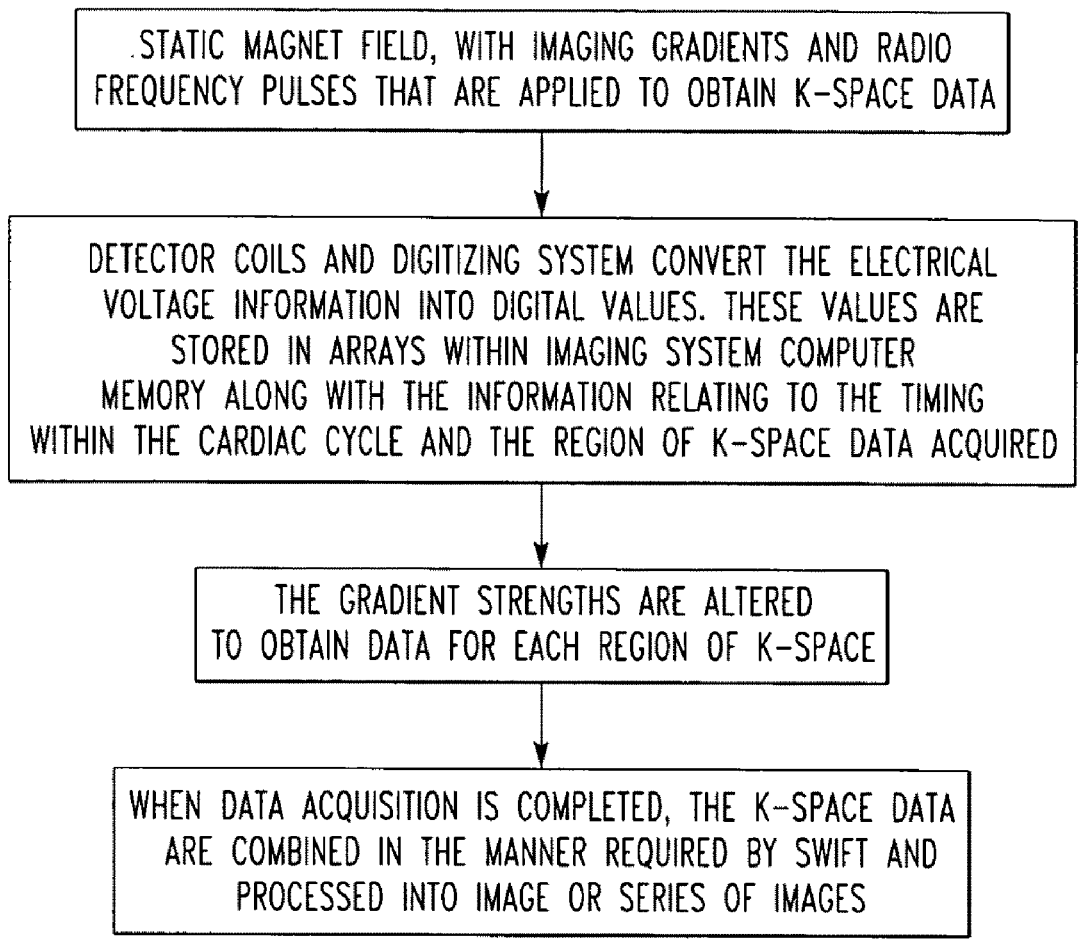
FIG. 11 is a flow chart regarding an MRI system.
Figure 12:
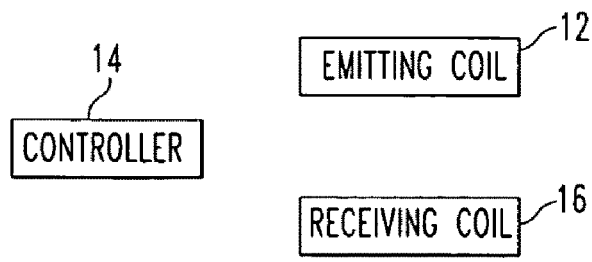
FIG. 12 is a block diagram of the system of the present invention.

Referring now to the drawings wherein like reference numerals refer to similar or identical parts throughout the several views, and more specifically to FIGS. 11 and 12 thereof, there is shown an MRI 10 to form an image of a patient. The MRI 10 comprises at least one emitting coil 12 which produces RF pulses and gradients. The MRI 10 comprises a controller 14 in communication with the emitting coil 12 for obtaining a steady-state image of the patient, where gradient areas balance to zero for each time repetition (TR) interval, and for causing the emitting coil 12 to produce the RF pulses without interruption during the time repetition interval. The MRI 10 comprises at least one receiving coil 16 in communication with the controller 14 which receives the RF pulses and provides the RF pulses to the controller 14 for the controller 14 to obtain the image.

Preferably, the controller 14 causes the gradients to target specific regions in K space during each TR interval, where at least two of the regions overlap in K space and at least one region of K space is not imaged with the gradients during a given TR interval, where data corresponding to the regions which overlap are time shifted such that corresponding k-space regions are removed from at least one data set and a series of data sets corresponding to each k-space region are inserted into a composite matrix without overlapping. The controller 14 preferably performs a Fourier transform on the composite matrix. Preferably, the controller 14 causes the receiving coil 16 to receive an echo signal split into an early, middle and late segment.

A three lobe gradient produced by the imaging coil is preferably used for the middle segment, and a two lobe gradient is used for the early and late segments. Preferably, the early, middle and late segments are about 25%, 50% and 25% respectively of the echo signal. The late echo segment preferably has a reversal of polarity compared with the early echo segment. Preferably, the early and late echo segments are traversed twice in the time repetition interval with the emitting coil 12. A phase encoding gradient lobe is preferably applied with the emitting coil 12 between the early and late segments to access a separate line in K space when the early and late segments are traversed the second time.

The present invention pertains to a method to form an image of a patient with an MRI 10. The method comprises the steps of producing RF pulses and gradients with at least one emitting coil 12. There is the step of obtaining a steady-state image of the patient with a controller 14 in communication with the emitting coil 12, where gradient areas balance to zero for each time repetition (TR) interval, and where the controller 14 causes the emitting coil 12 to produce the RF pulses without interruption during the time repetition interval. There is the step of receiving the RF pulses with at least one receiving coil 16 in communication with the controller 14 which provides the RF pulses to the controller 14 for the controller 14 to obtain the image.

Preferably, there is the step of causing the gradients with the controller 14 to target specific regions in K space during each TR interval, where at least two of the regions overlap in K space and at least one region of K space is not imaged with the gradients during a given TR interval, where data corresponding to the regions which overlap are time shifted such that corresponding k-space regions are removed from at least one data set and a series of data sets corresponding to each k-space region are inserted into a composite matrix without overlapping. There is preferably the step of performing a Fourier transform on the composite matrix with the controller 14. Preferably, there is the step of causing the receiving coil 16 with the controller 14 to receive an echo signal split into an early, middle and late segment.

There is preferably the step of producing by the imaging coil a three lobe gradient for the middle segment, and a two lobe gradient for the early and late segments. Preferably, the early, middle and late segments are about 25%, 50% and 25% respectively of the echo signal. There is preferably the step of reversing polarity of the late echo segment as compared with polarity of the early echo segment. Preferably, there is the step of traversing twice in the time repetition interval with the emitting coil 12 the early and late echo segments. There is preferably the step of applying a phase encoding gradient lobe with the emitting coil 12 between the early and late segments to access a separate line in K space when the early and late segments are traversed the second time.

The present invention pertains to an MRI to form an image of a patient. The MRI comprises at least one emitting coil which produces RF pulses and gradients. The MRI comprises a controller in communication with the emitting coil for obtaining a steady-state image of the patient's accelerating tissue, where gradient areas balance to zero for each time repetition (TR) interval, and for causing the emitting coil to produce the RF pulses without interruption during the time repetition interval. The MRI comprises at least one receiving coil in communication with the controller which receives the RF pulses and provides the RF pulses to the controller for the controller to obtain the image.

The present invention pertains to an MRI to form an image of a patient. The MRI comprises at least one emitting coil which produces RF pulses and gradients disposed in the structure. The MRI comprises a controller in communication with the emitting coil for obtaining a steady-state image of the patient's fat and liquid features by altering the fat and liquid spin phases to produce contrast, where gradient areas balance to zero for each time repetition (TR) interval, and for causing the emitting coil to produce the RF pulses without interruption during the time repetition interval. The MRI comprises at least one receiving coil disposed in the structure in communication with the controller which receives the RF pulses and provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's heart with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's short T2 tissue with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's tissue in proximity to an implant with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's accelerating tissue with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a method to form an image of a patient with an MRI. The method comprises the steps of producing RF pulses and gradients with at least one emitting coil. There is the step of obtaining a steady-state image of the patient's fat and liquid features by altering the fat and liquid spin phases to produce contrast with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's heart with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's short T2 tissue with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's tissue in proximity to an implant with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's accelerating tissue with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

The present invention pertains to a computer program embodied on a computer readable medium to form an image of a patient with an MRI. The program comprises the computer generated steps of producing RF pulses and gradients with at least one emitting coil. There is the step of obtaining a steady-state image of the patient's fat and liquid features by altering the fat and liquid spin phases to produce contrast with a controller in communication with the emitting coil, where gradient areas balance to zero for each time repetition (TR) interval, and where the controller causes the emitting coil to produce the RF pulses without interruption during the time repetition interval. There is the step of receiving the RF pulses with at least one receiving coil in communication with the controller which provides the RF pulses to the controller for the controller to obtain the image.

In a steady state free precession (SSFP) imaging sequence, the time of repetition (TR) of the imaging sequence, i.e. during each TR period a line segment of k-space is acquired, is limited by the degree to which the spin system retains coherence. Typically, the main limiting factor in this is not the inherent coherence time of the spin system, indicated by its T2 relaxation time parameter, but by the inhomogeneity of the main magnetic field, $B_0$ in Tesla (T). For a system with inhomogeneity expressed in parts per million (PPM), a spin system such as water with a gyromagnetic ratio of 42,666,667 Hz/T, the time in milliseconds for the spin system to dephase by 180°, $D_{180}$, is given by $$D_{180} = 1000/(2 \times PPM \times 42,666,667 \times B_0)$$

For example, for the field strength of 1.5 T, and an inhomogeneity of 2 parts per million, $D_{180}$=3.9 ms. The consequence of this is that to avoid signal loss due to dephasing effects the TR should be less than $D_{180}$. In practice, this is rarely achieved, and some degree of spin dephasing artifact is typically present. Further, this is more problematic as the main magnetic field strength increases, e.g. for the same relative inhomogeneity of magnet field at 3 T, $D_{180}$=1.9 ms, and for this reason, 3 T systems require higher levels of inhomogeneity correction than do 1.5 T systems. One key feature in reducing the TR is to employ high-performance gradients. Typically, similar high performance gradients are employed on 1.5 T systems as are used in 3 T systems. The current invention, SWIFT, allows the TR to be reduced for a given performance level of the gradient system.

A computer program embodied on a computer readable medium to form an image of a patient with an MRI 10 comprising the computer generated steps of producing RF pulses and gradients with at least one emitting coil 12. There is the step of obtaining a steady-state image of the patient with a controller 14 in communication with the emitting coil 12, where gradient areas balance to zero for each time repetition (TR) interval, and where the controller 14 causes the emitting coil 12 to produce the RF pulses without interruption during the time repetition interval. There is the step of receiving the RF pulses with at least one receiving coil 16 in communication with the controller 14 which provides the RF pulses to the controller 14 for the controller 14 to obtain the image.

Figure 2A:
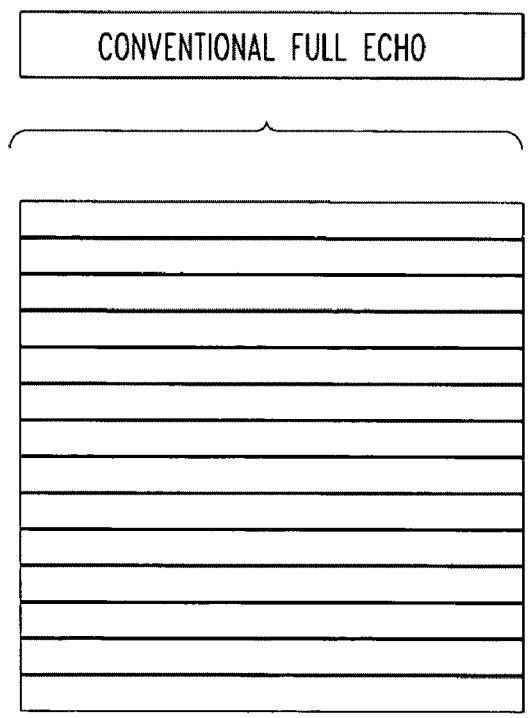
FIGS. 2a and 2b show the echo splitting aspect of SWIFT.
Figure 2B:
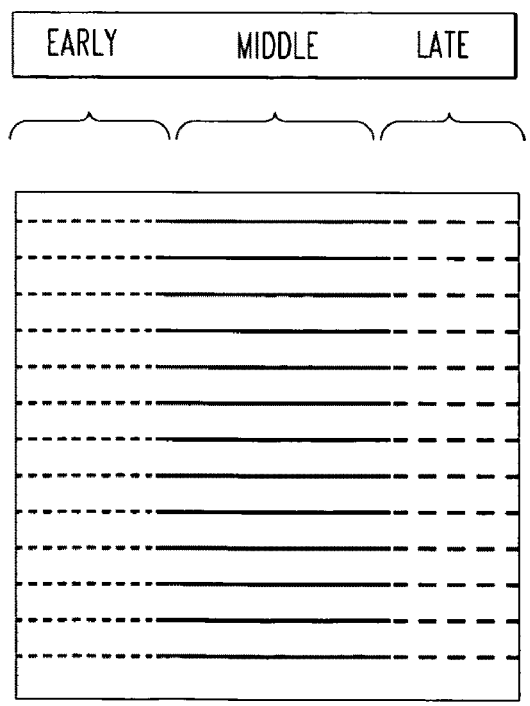

In the operation of the preferred embodiment of the invention, called SWIFT, splits-up the echo acquisition into three segments: "early", "middle" and "late", FIGS. 2*a* and 2*b*. In FIGS. 2*a* and 2*b*, the echo splitting aspect of SWIFT is illustrated. In FIG. 2*a*, a conventional k-space matrix is represented, in which each line of k-space is acquired as a single echo signal. In SWIFT, FIG. 2*b*, each line is split into three echo segments. In this example, the "early" (dotted line) and "late" (dashed line) segments each occupy 25% of the line, while the "middle" (solid line) section occupies 50% of the line. Since the read-out time for each echo segment only represents a fraction of the complete echo, the minimum TR can be reduced. For example, when increasing the matrix by 50% from 256×256 to 384×384, the TR might increases from 4 ms to 5 ms on a scanner with high-performance gradients e.g. 40 mT/m maximum strength and 150 mT/m/s maximum slew rate. When using SWIFT, the TR of 4 ms can be maintained or even reduced slightly (~10%) for the higher matrix scan. Calculations performed using gradient performance characteristics typical of a high-performance scanner show that the SWIFT can be used to double the basic scan matrix (e.g. from 256×256 to 512×512), while not increasing the minimum TR. Potential applications include allowing a high-performance scanner to be able to access the higher resolution available to the SSFP imaging sequence, while a low performance scanner, e.g. one only capable of producing a 128×128 matrix without obtrusive inhomogeneity related artifact, would be capable of producing a 256×256 matrix without increasing the gradient performance.

Figure 3:
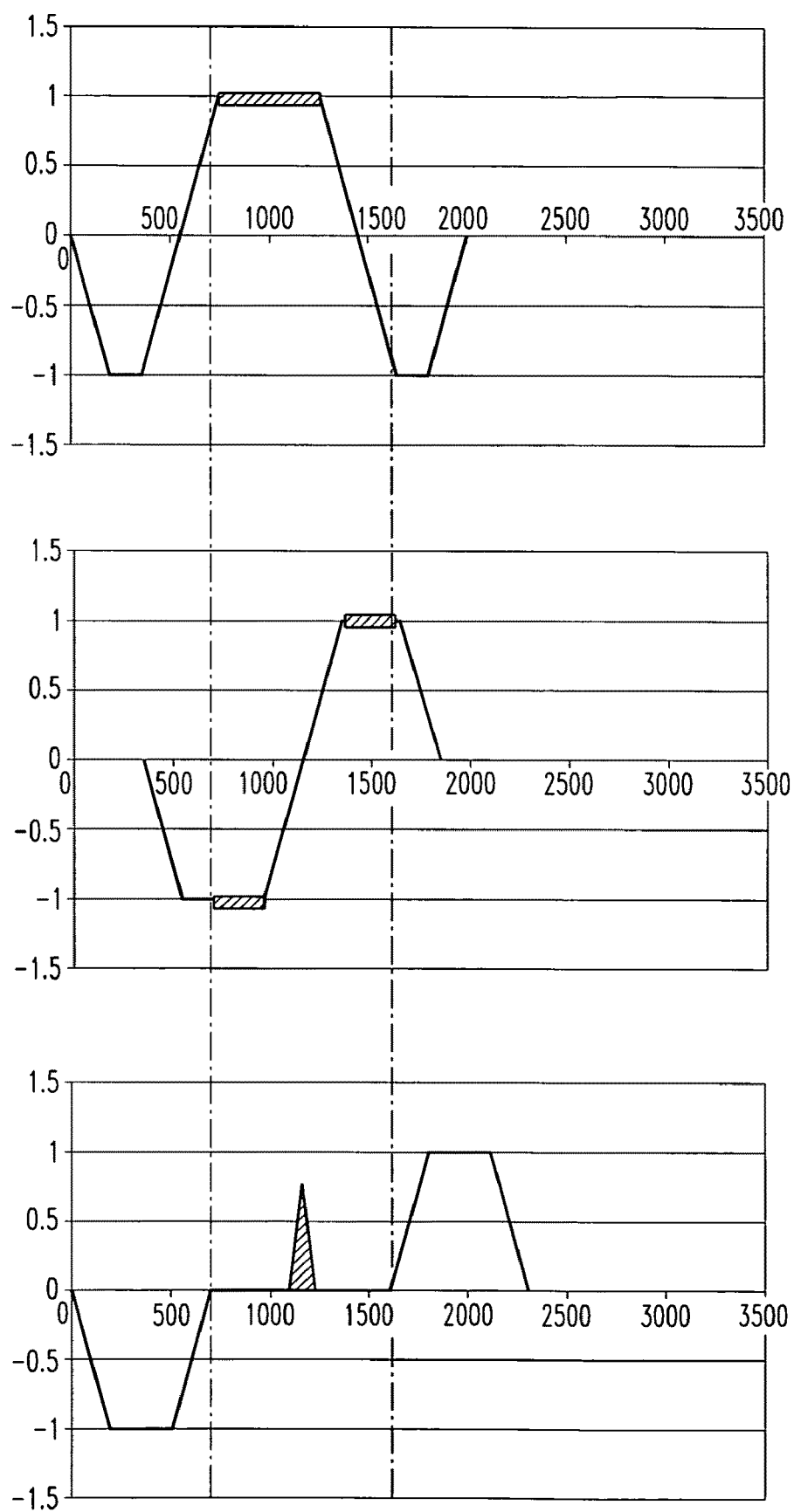
FIG. 3 shows the spatial encoding gradients for the SWIFT sequence are shown for the middle echo segment (top panel), the early echo segments (middle panel) and the phase encoding gradient (lower panel).

A key feature of SSFP imaging is that all gradients must balance to zero over each TR interval. This is efficiently accomplished in SWIFT when the echo signal is split up into early (e.g. 25% of echo), middle (e.g. 50% of echo) and late (e.g. 25% of echo) segments, FIG. 3. In FIG. 3, the spatial encoding gradients for the SWIFT sequence are shown for the middle echo segment (top panel), the early echo segments (middle panel) and the phase encoding gradient (lower panel). During any given TR interval, only one of the echo segment reading gradients will be performed (e.g. only a middle echo section is read out during one TR interval, and an early echo segment is read out during a separate TR interval). The thick gray line indicates when data are sampled. For the middle echo segment, this is a contiguous signal read-out. For the early echo segment, this is performed in two sections. The first read out section can be used to sample the early echo segment for one line of k-space while the second echo segment can be used to read out a second line of k-space by application of an additional small phase encoding gradient (indicated by solid triangle) applied during the measurement gradient switch period (but not applied for the middle echo segment). The vertical lines indicate where it is permissible to read out signal, corresponding to when no phase encoding gradients are applied. The net amount of signal read out time when combining the three echo segments in this example is comparable to that of FIG. 1, where the gradients occupied 3000 time units, but in SWIFT the gradients occupy only about 2300 time units. Note that the late echo portions are read out in a similar manner to the early portions, but with gradient polarities reversed.

Two distinct gradient waveforms are used to accomplish this, with the middle echo segment requiring a three-lobe gradient, and the early and late segments requiring a two-lobe gradient configuration. The major difference between the early and late echo segments being reversal of the gradient polarities. The two-lobe design of the early or late echo segments allows the early or late echo segment to be traversed twice in each TR. To increase the efficiency of the early or late segment read-outs, an additional phase encoding gradient lobe can be applied during the gradient switching period between these two read out periods, allowing the second read-out period to access a separate line in k-space, thereby increasing the efficiency of SWIFT (FIG. 3). Based on typical high-performance gradients, the additional phase encoding gradient, can be applied to measure lines separated by over 25% of k-space, but typically, the scan could be arranged to read-out separate lines closer than this. Further, the polarity of the additional phase encoding gradient can be arranged, such that the balancing compensating gradient would subtract, and not add, to the conventional balancing phase encoding gradient lobe, thereby allowing further reduction in the TR. Thus, reading two early or late k-space segments per TR increases the efficiency of SWIFT, and does not extend the TR. Conversely, only one middle echo segment is acquired per TR using the SWIFT scheme. The most efficient distribution of the echo between segments is dependant on the signal read-out time required and details of the gradient performance. In the examples given here, the early and late segments are assigned 25% of the full echo read-out, with the middle segment is assigned the remaining 50%.

Figure 4:
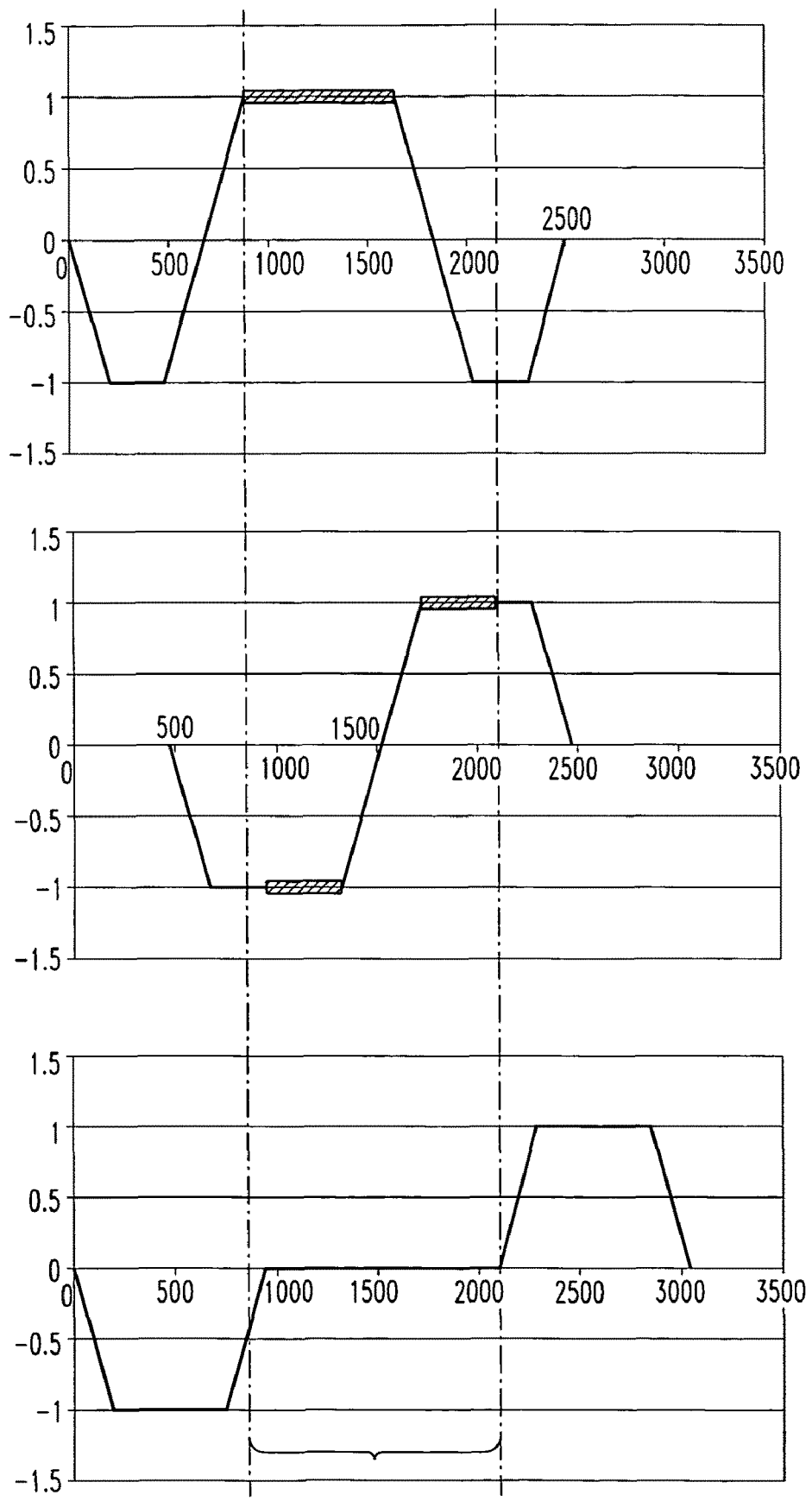
FIG. 4 shows the measurement and phase encoding gradients for SWIFT implemented to increase the phase and measurement gradients by 50% compared to the conditions of FIG. 1.

While SWIFT effectively splits up the measurement or frequency encoding gradient read-out, it does not affect the requirements for the phase encoding gradient. In the example of FIG. 4, where the basic scan matrix is increased by 50%, the increased gradient area of the phase encoding gradients effectively reduces the time available for reading-out the echo signal. In this specific example, it can be seen that the time to read-out the early or late segments forms the limiting feature governing the minimum TR since the middle segment is completed within a slightly shorter time. In this example, adjusting the distribution of the full echo between segments could allow a further slight reduction in the TR, e.g. early and late segment occupy 20% of full echo, while middle segment occupies 60%. The optimal allocation of echo time between segments is dependant on scanner details such as maximal gradient strength and maximal rise time. For the typical values given here, a split of 25%, 25%, 50%, for the early, late, and middle sections, respectively, is expected to satisfy most gradient configurations in current use, and the distribution is not expected to alter by more than 10% from these allocations. FIG. 4 shows the measurement and phase encoding gradients for SWIFT implemented to increase the phase and measurement gradients by 50% compared to the conditions of FIG. 1. Note that compared to FIG. 1, the gradient lobes of the phase encoding gradient occupy 50% more area and the time interval between phase encoding lobes defines the time available for signal read out. In this example, the TR interval increases only slightly to 3100 time units compared to 3000 time units in FIG. 1, while the cumulative echo read out time has increased by 50% and the phase encoding gradient has also increased by 50%. Also apparent from this figure, is that by distributing a greater portion of the echo read out to the middle section, allows a reduction of the read-out time for the early and late echo segments, which could bring the required time down to below 3000 units.

Figure 5:
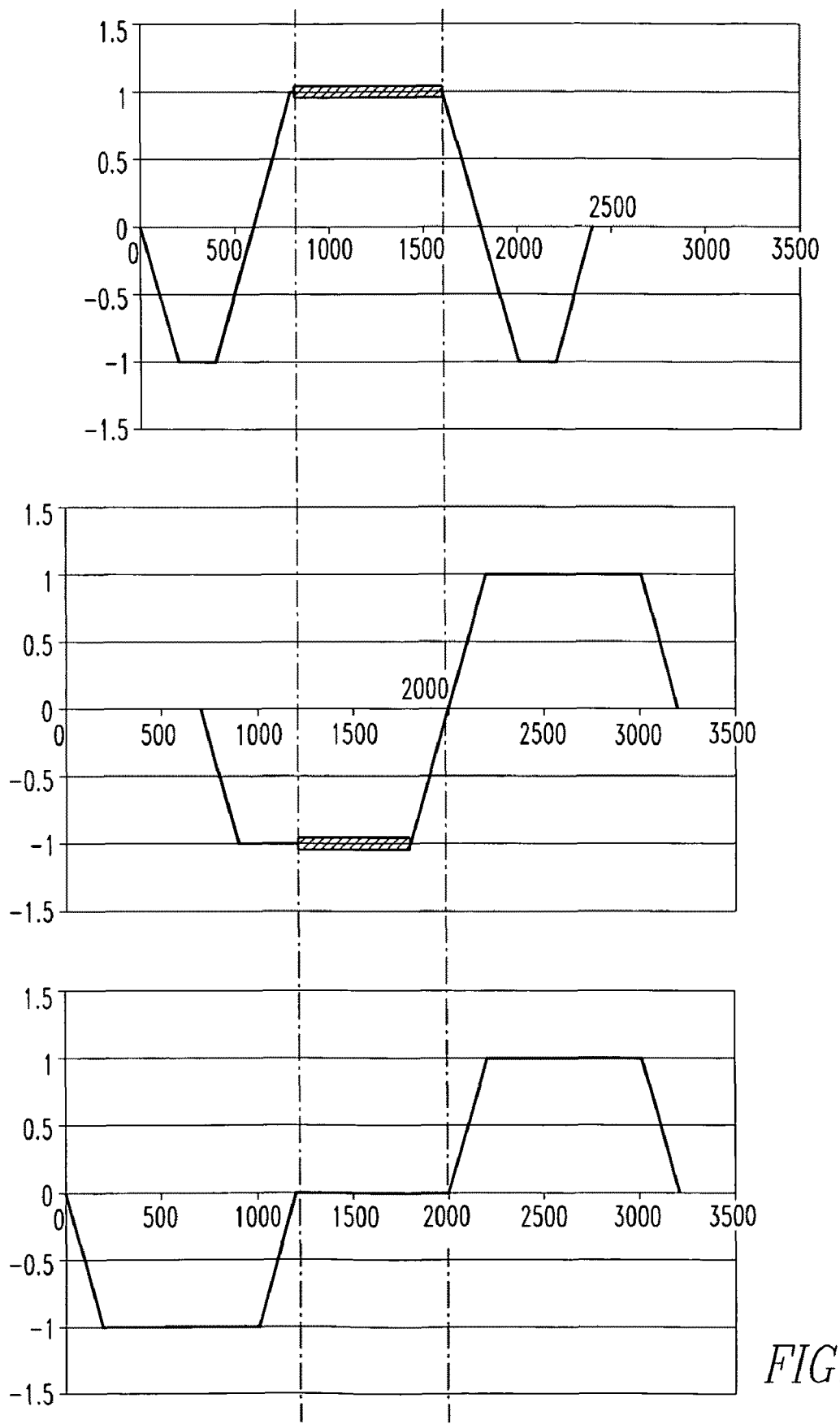
FIG. 5 shows an example of the measurement and phase encoding gradients used in SWIFT to double the measurement and phase encoding matrix compared to the example in FIG. 1.

When SWIFT is applied to double the net read-out time, there will typically not be sufficient time to read two early or late segments per TR, FIG. 5. In this case, only one early or late segment is read-out per TR. Thus, the arrangement of read-out gradients used in SWIFT to reduce the minimum TR compared to a conventional scan either doubles or triples the number of separate acquisitions required to compile k-space. In FIG. 5, an example of the measurement and phase encoding gradients used in SWIFT to double the measurement and phase encoding matrix compared to the example in FIG. 1. In the case of doubling the phase encoding value, the time interval allowed for reading-out signal (between vertical dashed lines) is generally too low to allow reading of two echo segments for the early or late segments, and only one segment is read out. Here the gradients fit in a time of 3200 time units, but as can be appreciated, there proportion of the echo segment assigned to the middle segment could be reduced and the early and late segments increased slightly, to further reduce the TR.

The doubling or tripling of scan time in SWIFT is applicable to imaging static objects (e.g. the brain). When applying SWIFT to image dynamic objects, such as the heart, SWIFT efficiently integrates a sparse sampling scheme previously described in the MACH invention (Doyle). The principle guiding the MACH sparse sampling scheme is that the sparse sampling factor increases in a smooth manner with distance from the center of k-space. In the original MACH disclosure, the sparse sampling scheme was applied to a series of full echo acquisitions. In these full echo acquisitions, the point of each echo closest to the center of k-space corresponds to the central point of the echo (i.e. the echo peak). Thus, since each line contained the central point, the sparse sampling rate was determined for the central point, but applied for the whole k-space line. In SWIFT, each k-space line contains separate early, late, and middle segments, with the early and late segments being further from the center of k-space than the corresponding middle segment. Thus, if the MACH sparse sampling scheme were applied in an identical manner to each k-space segment in SWIFT, the early and late segments would be relatively over-sampled compared to the middle segment, leading to a reduction in efficiency. Thus, separate sparse sampling schemes are applied to the early, middle and late segments. In SWIFT, the sparse sampling rate for each echo segment at each position in k-space is matched at the segment boundary satisfying the following conditions: 1) the MACH sampling scheme is calculated for the middle echo segment; 2) based on this middle echo segment sample pattern, a table is compiled relating the corresponding sparse sample rate and the distance of the center of each k-space line segment (i.e. the echo peak position) from the center of k-space; 3) for each line of k-space, the closest point of approach of the early echo segment to the k-space center is calculated; 4) based on the closest approach to the k-space center of the early echo segment, the sparse sampling factor is selected to MATCH the rate applied to the middle echo segment at that distance from the k-space center; and 5) due to symmetry, the sparse sampling rate calculated for the early echo segment is applied to the corresponding late echo segment. By this means, the sampling conditions for the middle echo segment are used to determine the sampling conditions for the early and late echo segments, FIG. 6. Thus, the most critical regions of each echo segment (i.e. the closest approach to the k-space center) are sampled in a matched manner. The MACH sampling scheme is integrated into SWIFT to reduce the scan time by a factor which is dependant on the scan requirements. In FIGS. 6a and 6b, the principle of how MACH sparse sampling factors are selected is illustrated. The principle of MACH sparse sampling is that the sparse sampling rate is selected based on the distance from the center of k-space. For the middle echo segment (FIG. 6a) for any given line, the central point of the segment defines the closest point to the center of k-space, and for the middle lines the MACH sparse sampling scheme is applied directly based on the height "h" of the central point from the center of k-space. For the early (or equivalently late) echo segments (FIG. 6b) the closest distance of the segment to the center of k-space is achieved for only one end of the segment. In this case the closest approach to the center (e.g. d) is straightforwardly calculated using the right angle triangle based on the fraction (e.g. 0.25) of the full k-space line length (e.g. L) and the height (e.g. h) above the central line. The sparse sampling factor for each early echo segment is then selected to match conditions already determined for the middle echo segment based on closest approach to the k-space center.

An example of the MACH sparse sampling scheme determined using the above algorithm applied to a SWIFT acquisition requiring a net scan time reduction factor of 4 is shown in FIG. 7. Note in this example, 1) the central 20% of k-space is acquired at a relatively high rate of a sparse sample factor less than 3, 2) the sparse sample rates for the early and mid echo segments differ the least from the middle segments either close to the central line or towards the edges of k-space, and 3) even at the extreme outer regions of k-space, the sparse sample factor does not exceed 8. Before performing each scan, the MACH sparse sampling conditions for the middle echo segment can be determined, which in turn, determines the sparse sampling rates for the early and late echo segments using the matching scheme outlined above, and the average sparse sampling rate can be calculated. The average sparse sampling rate is used to determine the scan time prior to initiating scanning. This allows adjustment in the sparse sampling rate to be made by the user prior to initiating a scan. In FIG. 7, the sparse sampling rates for the MACH sampling scheme used in SWIFT are illustrated. In this case, the sparse sampling rate for the first line in 16 equal vertical segments of k-space are indicated for the early middle and late echo segments. In this case, the net scan time reduction achieved over a fully resolved k-space matrix is a factor of 4. Note that over 20% of the central k-space data are sampled with a sparse factor of less than 3, and that for the outermost regions, the sparse factor does not exceed 8.

Following the acquisition the sparsely sampled data sets are temporally interpolated to generate k-space data for each echo region at each time point in the manner outlined in the MACH disclosure.

Figure 8A:
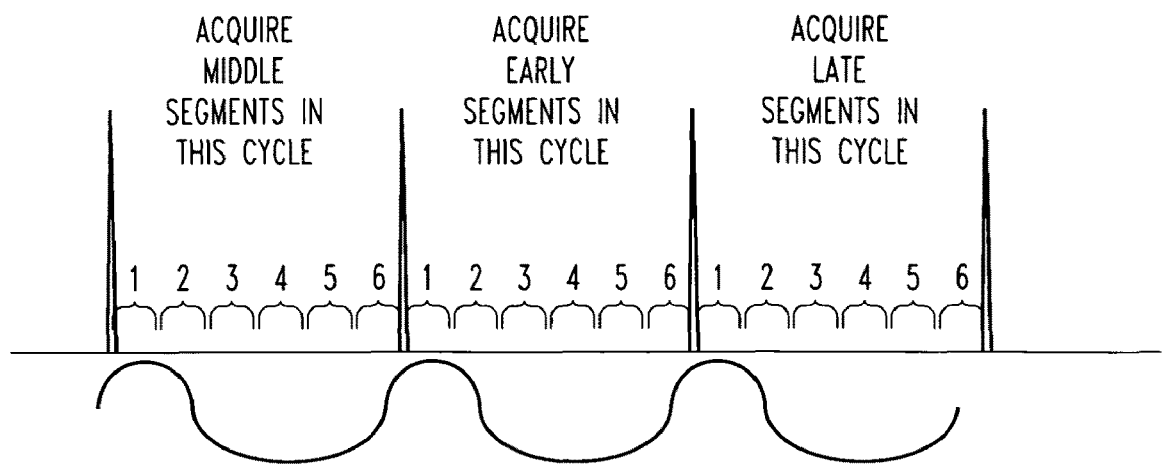
FIGS. 8a and 8b show the modes of applying SWIFT to cyclic (FIG. 8a) and non-cyclic (FIG. 8b) events.
Figure 8B:
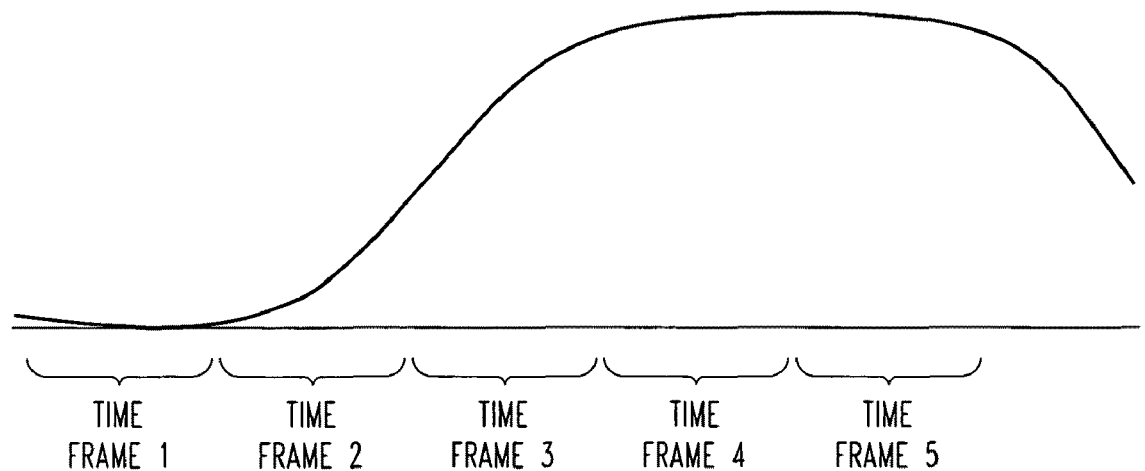

At one extreme, SWIFT can be applied to image static objects, and in this case, there is no requirement to sparsely sample along the time dimension, since the object is not in a state of change. For objects in a state of change, the manner of applying SWIFT is distinctly different for cyclic versus transitory events, FIG. 8. For cyclic events, such as cardiac imaging, the SWIFT scheme can be applied to acquire the temporally sparse data for each echo segment independent of when data are acquired for other segments, e.g. the middle segments might be sampled in one cardiac cycle, and the early segments in another (remote) cycle. However, objects in a transitory state of change (e.g. the vascular system when a contrast agent is passing through it) have to be sampled such that the early, middle, and late segments corresponding to each time frame are acquired before advancing to the next time frame. In FIGS. 8a and 8b, the modes of applying SWIFT to cyclic (FIG. 8a) and non-cyclic (FIG. 8b) events are indicated. In cyclic events (such as the cardiac cycle) data for each time frame within the cycle (1-6 in top panel) can be acquired over several cycles. In this mode, one cycle could be used to acquire middle segments, one cycle could be used to acquire early segments, etc. Imaging of cyclic events is limited by the number of cycles that can be maintained under similar conditions (e.g. a patient's ability to sustain a breathhold). Imaging transitory events is dependant on the rapidity with which k-space can be acquired compared to the rate of change of the phenomena being imaged. At each time frame, it is necessary to acquire early, middle, and late segments in an interleaved manner, before advancing to acquire k-space data for further time frames.

Figure 9:
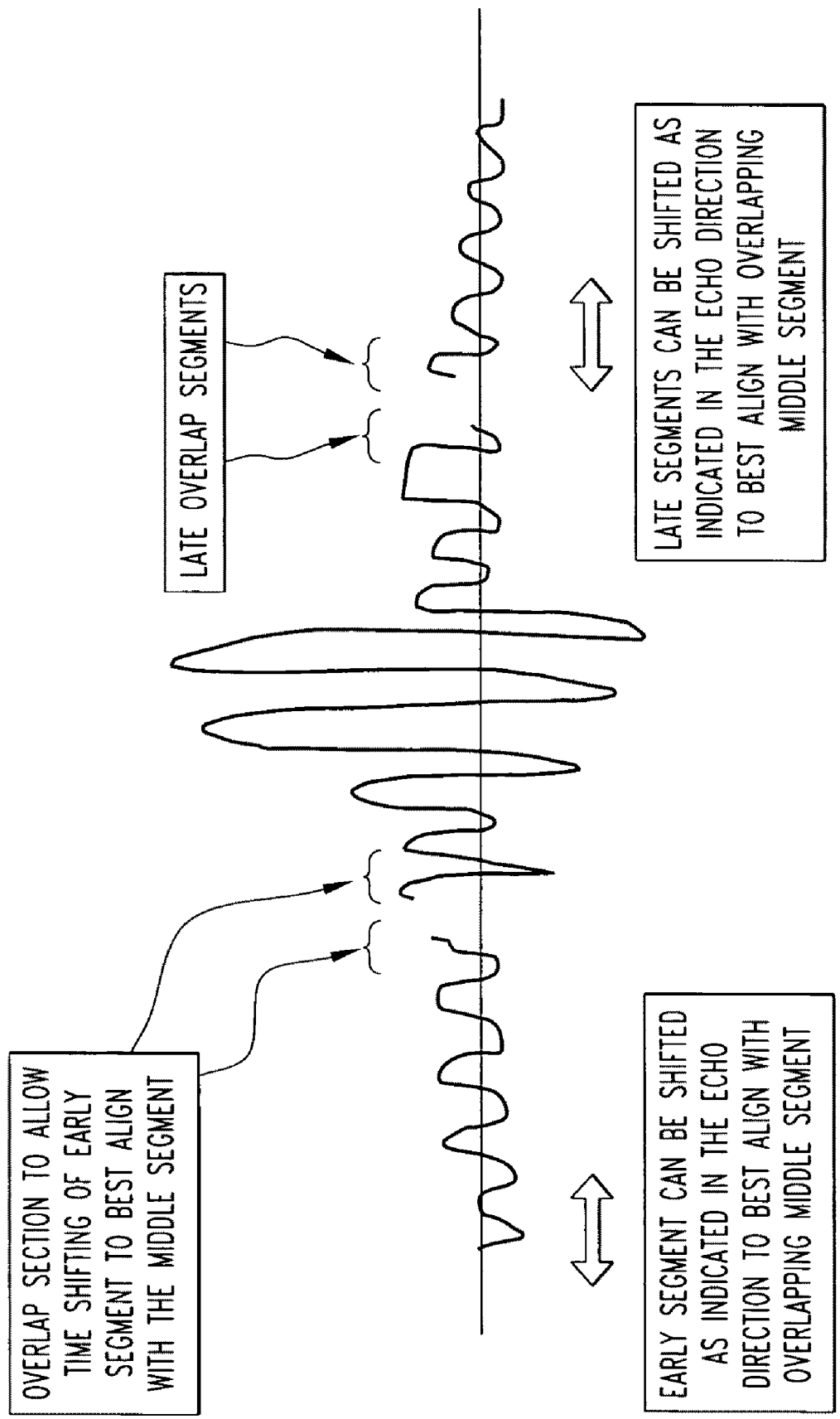
FIG. 9 shows the echo segment alignment process.

Following data acquisition and performing the interpolation processing required for the MACH process, it is necessary to ensure that the three echo segments corresponding to each k-space line are temporally aligned in the echo dimension, FIG. 9. This alignment can be accomplished by arranging for the middle segment to overlap the early and late segments, by e.g. 10 data points. Then, based on the central line of k-space, which has the overall highest signal, the early and late segments are shifted in the echo direction to find the point that best joins the data to the middle segment. The means to determine the best joint point could be based on a least squares difference criteria. In this process, the middle echo segment is not shifted. When the optimal time shifts for the early and late segments have been determined, these shifts are applied to all other lines of k-space for each matrix. In FIG. 9, the echo segment alignment process is indicated. Additional data (e.g. 10 points) for the early and middle echo segments are acquired such that the two segments overlap slightly. For the central line of k-space (i.e. the line with the most overall signal), the early echo segment is time shifted in the echo direction (as indicated) such that the early echo segment signal best matches the corresponding middle echo signal. Similar processing is applied to align the late echo segment. In this procedure, the middle echo segment is not shifted.

Figure 10:
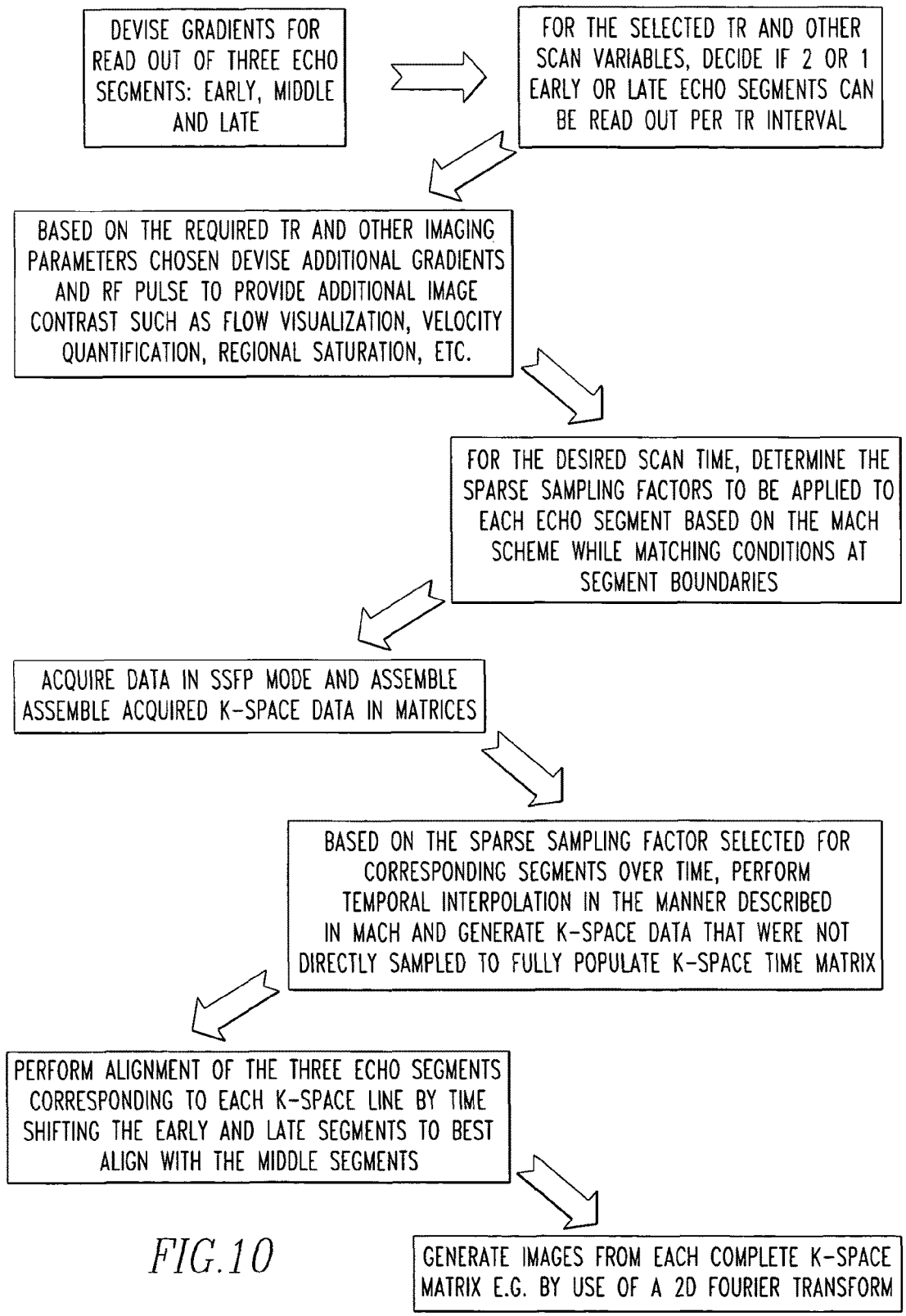
FIG. 10 is a block diagram of the manner of applying the SWIFT imaging sequence.

The SWIFT scheme is incorporated into an MRI 10 scanner, which includes the system of producing a main magnetic field, transmit RF power and receive RF signals in receiver channel(s) with imaging gradients applied in a time dependant manner. The SSFP imaging sequence incorporates an RF pulse that is usually applied in a slice selective manner. Typically, the RF pulse adds about 1 millisecond to the TR time of the sequence. For the specific examples given here of conventional SSFP and SWIFT sequences, the TR is assumed to be on the order of 4 ms, with the time units given in the examples being in microseconds, i.e. 3000 microseconds (3 milliseconds) being taken up by the read and phase encoding imaging gradients and allowing an additional 1 millisecond for slice selection. The RF slice selection gradients are not considered to be a limiting factor in SWIFT, since the gradient applied while the RF transmitter is on (about 1 millisecond typically) cannot have other gradients overlap with them. Thus, this dictates that any refocusing gradients associated with the RF pulse are completed in about 1 millisecond, and can usually be applied such that they overlap the phase encoding gradient lobes which are unaffected by the SWIFT scheme. Thus, the SWIFT scheme is applicable to MRI 10 scanners that have the basic capability of performing SSFP imaging. A block diagram of the SWIFT approach is shown in FIG. 10. The SWIFT sachem is implemented on a magnetic resonance imaging scanner.

The invention allows scanners to access higher resolution SSFP images than are currently feasible, typically allowing doubling of the scan matrix in the measurement direction or alternatively free up time in the TR to achieve additional contrast. This has application for scanners with high and low performance gradient systems. Scanners with low performance gradient systems include low cost scanners and scanners of the open-MRI 10 design, and for these systems, accessing higher scan matrices is envisaged as the main benefit. While scanners with high performance gradients, higher matrices are achievable, and it becomes feasible to affect additional contrast mechanisms such as enhancing flow visualization, incorporating flow quantification, and suppression of venous blood flow.

When applying SWIFT to increase the scan resolution, there are numerous modes of operation. Here two major application areas are illustrated using worked examples. In the first application, a high-performance MRI 10 scanner is considered, operating at a TR of 4 ms, and producing a 256× 256 scan matrix of the beating heart in a breath-hold time. Conventionally, when increasing the scan matrix by 50% to 384×384, there are several things that occur simultaneously: 1) extending the echo read-out to 384 results in a read-out time increased by 50%; 2) to form the longer echo requires a 50% increase in the area of the preparation gradients for the signal read-out, which requires that the balancing gradient following the signal read-out also increases by 50%; 3) the maximal area of the phase encoding gradient (and balancing gradient) increase in area by 50%. While gradient lobes can overlap when no data is being acquired, the increase in gradient areas and read-out times results in extending the TR of the basic scan sequence, and typically more phase role artifacts mar the image; and 4) the number of applied phase encoding gradients increases by 50%, which extends the scan time by 50% and typically extends it beyond a comfortable breath-hold time. In this case, SWIFT is applied to increase the matrix by 50% in both directions, and typically can accomplish this while maintaining the TR. To determine the MACH acceleration factor required to maintain the scan at a comfortable breath-hold the following logic is applied. Firstly, splitting the scan in to three echo segments, increases the basic scan time by a factor of 2, due to acquiring two line segments per TR for both the early and late echo segments. Secondly, increasing the number of phase encoding steps by 50% increases the scan by a factor of 1.5. Thus, to maintain the scan time of the original 256×256 scan, the reduction factor (MF) needed to be achieved by MACH is given by MF=2×1.5=3. This relatively low acceleration factor is not expected to noticeably reduce scan quality, which is likely to be indistinguishable from a much longer scan not employing MACH. For the average sparse factor of 3, the maximum sparse sampling factor does not exceed 6, and, almost 20% of k-space data are sampled at a sparse factor of less than 2, providing rapid update of the central region of k-space. Additionally, in this example, when increasing the scan matrix by 50% in the read and phase encoding directions, the voxel volume decreases by 44% (if the slice thickness is held constant). Thus, since fewer spins contribute to the signal, each echo signal drops by 44%. However, since the number of phase encoding lines increases by 50%, there is a SNR benefit related to the square root of 1.5, i.e. approximately 1.2. Further, since the effective signal read out time also increases by 50% due to the use or SWIFT, the bandwidth per pixel also decreases by 50%, leading to an increase in SNR of 1.2. Thus, the net SNR of the 384×384 scan compared to the original lower resolution scan is 1.2×1.2×0.44=63%. The loss in SNR is comparable to the loss associated with parallel imaging used to reduce the scan time for a 256×256 scan by 50%, leading to a net SNR of 70%, which is typically acceptable. Thus, the additional resolution provided by SWIFT in this case is likely to produces images with acceptable CNR and increased resolution.

In the second example, a low-performance MRI 10 scanner is considered, which is only capable of producing a 128×128 matrix with a sufficiently short TR such that inhomogeneity artifacts do not dominate the images. Further, since only 128 phase encoding lines are used, the scan time is typically performed well within a comfortable breath-hold time. In this case, we require doubling of the read-out and phase encoding dimensions to 256. When applying the SWIFT sequence to double the read-out signal, and double the phase encoding dimension, there is only sufficient time to read out one early or late echo segment per TR interval and thus the three echo segments per line require three separate TR intervals, increasing the scan time by a factor of 3 (FIG. 5). Further, when also doubling the number of phase encoding lines, the net scan time is increased by a factor of 6 compared to the original (128×128 matrix) scan. However, to acquire 128 phase encoding lines typically can be accomplished in a very short breath-hold time. Thus, there is typically no restraint to maintain the scan time, since this time is already very short. Thus, in this case, the basic scan time can be doubled and still be accomplished in a conventional breath-hold acquisition time (e.g. <15 s). Given this, a MACH acceleration factor of three can be used in this scan, and is expected to provide excellent image quality and representation of moving structures. In the case of a 128×128 scan, the SNR is likely to be very high, due to the large voxel sizes. Applying similar logic as above, the reduction in voxel size associated with the higher resolution scan decreases the basic signal to 25% of the original. The doubling of the read-out time and doubling of the number of phase encoding steps, each increase the SNR by square root of 2, leaving a net SNR of 50% of the original. Given that such a low-resolution scan has excessive SNR, this reduction in SNR is likely to be routinely acceptable.

A benefit of SWIFT is that not only is the TR kept short, but that there is decreased sensitivity to local susceptibility gradients, allowing improved imaging in the presence of surgical implants. The problem with imaging in the vicinity of implants is that inhomogeneities due to the implant destroy or distort signal in the vicinity of the implant, thus limiting clinical evaluation. In the SSFP sequence, spin dispersion due to field inhomogeneities are minimized at the center of the TR interval (due to a spin-echo type refocusing). Conventionally, in a single echo read-out the effects of inhomogeneity are only compensated for at the center of the echo, but in SWIFT, the middle echo segment is compensated and the early and late segments, acquired close to the center will also experience a high degree of spin refocusing due to inhomogeneities. In the version of SWIFT which acquires only one segment per TR, this aspect is further enhanced, as data acquisition can be arranged to be in the center of the TR period. Thus, it is expected that improved image data closer to implants can be achieved using SWIFT compared to conventional imaging.

Applying SSFP imaging to high magnetic field strength systems (such as 3 T) is problematic due to excessive power deposition (RF power increases with the square of field strength, i.e. 4 times the power deposition compared to a 1.5 T system, leading to an increase in the specific absorption rate (SAR)), and due to the inhomogeneity of the system being proportionately worse compared to a lower field system (e.g. for a given parts per million (PPM) level of inhomogeneity, the absolute degree of spin dephasing increases with field strength). These constraints make imaging using SSFP problematic at 3 T. In this case, SWIFT can be employed to maintain the scan matrix (e.g. 256×256) but accomplish acquisition of this matrix in three segments. When SWIFT is applied to acquire the three echo segments in three separate passes, the TR can be reduced by about 25% when maintaining scan resolution. The net scan time is calculated using the following reasoning: acquisition of the three echo segments, increases the basic scan time by a factor of 2; reducing the TR by 25% allows an increase in the segmentation value by 25%, thereby reducing the scan by a factor of 0.75; employing MACH to accelerate the scan by a factor of 4, reduces the scan time by a factor of 4, thus the net scan time is 2×0.75/4=0.37 of the original. The number of RF pulses delivered is calculated using the following reasoning: decreasing TR by 25%, increases the rate of delivery of RF by 1/0.75; doubling the number of passes due to acquiring multiple segments, increases the number of pulses by a factor of 2; employing MACH sparse sampling with a factor of 4 decreases the RF by a factor of 4. Thus the net number of RF pulses delivered is given by 2/(0.75×4)=0.67 of the original. Thus, SWIFT can benefit the high-field application by 1) reducing the TR to overcome the absolute increase in field deviation over the body, and 2) reducing the amount of RF energy deposited in the body, to alleviate the SAR constraints.

When implementing SWIFT in a mode that maintains the TR it is possible to free up a time period within the TR where additional pulses and gradient can be applied to introduce contrast not normally achievable in SSFP images. Examples of these additional contrast pulses are: flow sensitizing gradients; RF pulses to produce specific contrasts, such as arterial spin labeling and suppressing spatial regions; and gradients that allow flow quantification.

Flow Sensitizing—SSFP imaging produces bright blood signal due to its inherent insensitivity to blood motion. While this may be an advantage for producing excellent blood-myocardial contrast in cardiac applications, it detracts from the ability to detect flow anomalies, such as the presence of jet flow near incompetent or stenotic valves, because these features contribute a bright signal that is indistinguishable from normal blood flow. Frequently, when flow anomalies are suspected, SSFP imaging is abandoned in favor of gradient recalled echo imaging, which produces images of considerably lower quality but with flow anomalies visible as regions of signal loss. To make SSFP imaging sensitive to flow, a bipolar gradient could be added to the sequence prior to signal read-out. When using SWIFT and maintaining the scan matrix, approximately 25% of the TR interval can be free-up prior to signal read-out to allow introduction of these gradients. They would accomplish a degree of dephasing of flowing blood in relationship to the blood's velocity, which would render that blood as a dark signal. No such scheme has previously been used, since introducing these gradients to a conventional SSFP sequence increases the TR beyond that required for low artifact imaging.

Flow Quantification—Flow quantification is feasible with SSFP imaging but has not been commercially implemented due to the problems of keeping the TR sufficiently short. When using SWIFT, time prior to signal read out is required to produce velocity sensitive phase differences, and following signal read-out the balanced gradients are required to refocus both moving and static spins to optimally contribute to successive signals. Using SWIFT, it is possible to incorporate these additional gradients to achieve velocity quantification.

Additional RF pulses—SWIFT can be implemented to free up time in a given TR interval sufficient to allow application of additional RF pulses. The unique feature of applying RF pulses is that gradients not associated with the operation of the RF pulse cannot be applied while that RF pulse is applied. Typically, an RF pulse is applied for 1 ms, and for a target TR of 4 ms, it is possible using SWIFT to free up this amount of time for a conventional resolution scan (e.g. 256×256). This possibility allows capabilities such as incorporating regional selective pulses during each TR interval, without disrupting the steady-state conditions required for SSFP imaging. Possible applications include arterial spin labeling; where a region either side of the slice of interest is excited, and regional saturation of signal to preferentially suppress blood flow from one direction.

The SWIFT scheme for splitting the measurement of an echo into three segments is directly applicable to 2D and 3D imaging. The major difference between 2D and 3D imaging is in the manner of applying the phase encoding gradients, which remain unaffected by SWIFT. In the 3D case, the measurement gradient is split up in the manner indicated in SWIFT. The manner of applying MACH sparse sampling is similarly matched to the middle echo positions, but in this case, the closest distance to the center of k-space is calculated in three dimensions as opposed to two.

The closest technology to SWIFT is FAcE, FID Acquired Echo. Maier S.E.1; Scheidegger M. B.; Kecheng L.; Boesiger P. Accurate velocity mapping with FacE. Magnetic Resonance Imaging, Volume 14, Number 2, 1996, pp. 163-171(9). In the FAcE technique, the echo signal is split into two halves, sampling from the center of k-space in one acquisition towards one edge of k-space, and in the second acquisition, sampling towards the opposite edge. The approach is primarily suited to gradient echo imaging, and no aspect of sparse sampling is incorporated. The split sampling of the echo is accomplished in two symmetric halves. In the preferred embodiment of the current invention, SWIFT differs from FAcE in the following important particulars:

| FacE | SWIFT |
|---|---|
| FAcE splits the echo acquisition into two symmetric sections. The difference between the two sections is that they are acquired with the same gradient waveform, but with the gradients reversed in polarity. Effectively, each echo segment is acquired from the center of k-space towards the edge. FAcE employs a preparation read gradient that is sufficient only to balance the primary read gradient, and only allows acquisition of a signal decay section. As the name incorporates, each signal half can be regarded as a Free Induction Decay (FID) as opposed to an echo signal, and that | SWIFT splits the echo acquisition into three asymmetric sections. The middle echo segment symmetrically spans the center of k-space. To acquire the middle echo segment in SWIFT a conventional preparation gradient is applied and a conventional gradient echo read out is used. Depending on implementation, two early or late echo segments are acquired in a single TR period. The first early or late echo segment that is read out can be regarded as the trailing edge of an FID signal, there being no requirement as in FAcE to read this out from its origin at the center of k-space, while the second echo segment can be regarded |

| FAcE | SWIFT |
|---|---|
| each FID signal is read in its entirety from the center of k-space to the outer edge. | as a gradient echo signal, again, not read-out to the echo peak position. |
| In FAcE, each echo segment is acquired from the center of k-space to wards the edge. Since the echoes are symmetric, each segment is joined together at the echo peak (along a central line of k-space). Since they are joined along the seam of maximal signal, there is the greatest possibility of introducing signal miss-match artifact. | In SWIFT, echo segments are joined along lines remote from the central region of k-space, reducing the effects of any residual signal miss-match. |
| FAcE is only applicable to gradient echo imaging since the spin phase is left in a dephased state at the end of each application of the sequence. | SWIFT is applicable to SSFP imaging, since a key feature of SSFP imaging is that the phase of the spin system has to be balanced to zero at the end of each application of the sequence and this is efficiently accomplished in SWIFT by applying appropriate preparation and post signal acquisition gradient lobes to balance the gradient area to zero, thereby bring the spin phase to zero. |
| FAcE does not incorporate a separate sparse sampling pattern for each echo segment and therefore the scan time is doubled compared to a conventional, single echo acquisition. | When applied to dynamic imaging, SWIFT incorporates MACH sparse sampling, with the patterns customized to each echo segment, such that scan time is not necessarily extended beyond that of a conventional single echo acquisition. |

Differences and advantages of this technology over other technology or prior art:

Commercial systems have largely focused on reducing the TR of SSFP sequences by utilizing high-performance gradient systems. These gradient systems have an upper limit of performance, since there is a neuromuscular physiologic interaction with the body such that when strong gradients switch rapidly they induce muscular twitching. This occurs when the gradient slew rate approaches or exceeds about 200 milli Tesla per meter per second. Currently, most commercial systems restrict gradients to below 160 milli Tesla per meter per second. Thus, further reduction of TR by increasing gradient performance has limited applicability for whole body imaging systems (limited extent gradients have been developed for limited field of view imaging and brain imaging, but are not generally applicable for whole body imaging).

In a recent NIH sponsored panel discussion of experts, concerning the use of 3 T field systems for performing cardiovascular imaging it was suggested that the problems associated with SSFP imaging may not be overcome, and that users might consider reverting to using gradient echo imaging. Thus, in this case, the solution was to abandon SSFP imaging in favor of a technique with lower blood-myocardial contrast.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

The invention claimed is:

1. An MRI to form an image of a patient comprising:
at least one emitting coil which produces gradients;
a controller in communication with the emitting coil for obtaining a steady-state image of the patient, where gradient areas balance to zero for each time repetition (TR) interval, the controller causes the gradients to target three specific asymmetric regions in K space during each TR interval, where at least two of the regions overlap in K space and at least one region of K space is not imaged with the gradients during a given TR interval; and
at least one receiving coil in communication with the controller which receives an echo signal of the three specific asymmetric regions and provides the echo signal gradients to the controller for the controller to obtain the image, where data corresponding to the regions which overlap are time shifted such that corresponding k-space regions are removed from at least one data set and a series of data sets corresponding to each k-space region are inserted into a composite matrix without overlapping.

2. An MRI as described in Claim 1 wherein the controller performs a Fourier transform on the composite matrix.

3. An MRI as described in claim 2 wherein the controller causes the receiving coil to receive an echo signal split into an early, middle and late segment.

4. An MRI as described in claim 3 wherein a three lobe gradient produced by the imaging coil is used for the middle segment, and a two lobe gradient is used for the early and late segments.

5. An MRI as described in claim 4 wherein the early, middle and late segments are about 25%, 50% and 25% respectively, of the echo signal.

6. An MRI as described in claim 5 wherein the late echo segment has a reversal of polarity compared with the early echo segment.

7. An MRI as described in claim 6 wherein the early and late echo segments are traversed twice in the time repetition interval with the emitting coil.

8. An MRI as described in claim 7 wherein a phase encoding gradient lobe is applied with the emitting coil between the early and late segments to access a separate line in K space when the early and late segments are traversed the second time.

9. A method to form an image of a patient with an MRI comprising the steps of:
producing gradients with at least one emitting coil;
obtaining a steady-state image of the patient's heart with a controller in communication with the emitting coil, where gradient areas balance to zero for each time repetition (TR) interval, which includes the step of causing the gradients with the controller to target three specific asymmetric regions in K space during each TR interval, where at least two of the regions overlap in K space and at least one region of K space is not imaged with the gradients during a given TR interval; and
receiving an echo signal of the three specific asymmeteric regions with at least one receiving coil in communication with the controller which provides the echo signal to the controller for the controller to obtain the image, where data corresponding to the regions which overlap are time shifted such that corresponding k-space regions are removed from at least one data set and a series of data sets corresponding to each k-space region are inserted into a composite matrix without overlapping.

10. A method as described in Claim 9 including the step of performing a Fourier transform on the composite matrix with the controller.

11. A method as described in claim 10 including the step of causing the receiving coil with the controller to receive an echo signal split into an early, middle and late segment.

12. A method as described in claim 11 including the step of producing by the imaging coil a three lobe gradient for the middle segment, and a two lobe gradient for the early and late segments.

13. A method as described in claim 12 wherein the early, middle and late segments are about 25%, 50% and 25%, respectively, of the echo signal.

14. A method as described in claim 13 including the step of reversing polarity of the late echo segment as compared with polarity of the early echo segment.

15. A method as described in claim 14 including the step of traversing twice in the time repetition interval with the emitting coil the early and late echo segments.

16. A method as described in claim 15 including the step of applying a phase encoding gradient lobe with the emitting coil between the early and late segments to access a separate line in K space when the early and late segments are traversed the second time.

17. A computer program embodied on a computer readable medium to form an image of a patient with an MRI comprising the computer generated steps of:
producing gradients with at least one emitting coil;
obtaining a steady-state image of the patient with a controller in communication with the emitting coil, where gradient areas balance to zero for each time repetition (TR) interval, which includes the step of causing the gradients with the controller to target three specific asymmetric regions in K space during each TR interval, where at least two of the regions overlap in K space and at least one region of K space is not imaged with the gradients during a given TR interval; and
receiving an echo signal of the three specific asymmetric regions with at least one receiving coil in communication with the controller which provides the echo signal to the controller for the controller to obtain the image, where data corresponding to the regions which overlap are time shifted such that corresponding k-space regions are removed from at least one data set and a series of data sets corresponding to each k-space region are inserted into a composite matrix without overlapping.

18. An MRI to form an image of a patient comprising:
an open bore structure;
at least one emitting coil which produces gradients disposed in the structure;
a controller in communication with the emitting coil for obtaining a steady-state image of the patient, where gradient areas balance to zero for each time repetition (TR) interval, the controller causes the gradients to target three specific asymmetric regions in K space during each TR interval, where at least two of the regions overlap in K space and at least one region of K space is not imaged with the gradients during a given TR interval; and
at least one receiving coil disposed in the structure in communication with the controller which receives an echo signal of the three specific asymmetric regions and provides the echo signal gradients to the controller for the controller to obtain the image, where data corresponding to the regions which overlap are time shifted such that corresponding k-space regions are removed from at least one data set and a series of data sets corresponding to each k-space region are inserted into a composite matrix without overlapping.

19. A method to form an image of a patient with an MRI comprising the steps of:
producing gradients with at least one emitting coil;
obtaining a steady-state image of the patient's heart with a controller in communication with the emitting coil, where gradient areas balance to zero for each time repetition (TR) interval, which includes the step of causing the gradients with the controller to target three specific asymmetric regions in K space during each TR interval, where at least two of the regions overlap in K space and at least one region of K space is not imaged with the gradients during a given TR interval; and
receiving an echo signal of the three specific asymmetric regions with at least one receiving coil in communication with the controller which provides the echo signal to the controller for the controller to obtain the image, where data corresponding to the regions which overlap are time shifted such that corresponding k-space regions are removed from at least one data set and a series of data sets corresponding to each k-space region are inserted into a composite matrix without overlapping.

20. A method to form an image of a patient with an MRI comprising the steps of:
producing gradients with at least one emitting coil;
obtaining a steady-state image of the patient's short T2 tissue with a controller in communication with the emitting coil, where gradient areas balance to zero for each time repetition (TR) interval, which includes the step of causing the gradients with the controller to target three specific asymmetric regions in K space during each TR interval, where at least two of the regions overlap in K space and at least one region of K space is not imaged with the gradients during a given TR interval; and
receiving an echo signal of the three specific asymmeteric regions with at least one receiving coil in communication with the controller which provides the echo signal to the controller for the controller to obtain the image, where data corresponding to the regions which overlap are time shifted such that corresponding k-space regions are removed from at least one data set and a series of data sets corresponding to each k-space region are inserted into a composite matrix without overlapping.

21. A method to form an image of a patient with an MRI comprising the steps of:

producing gradients with at least one emitting coil;

obtaining a steady-state image of the patient's tissue in proximity to an implant with a controller in communication with the emitting coil, where gradient areas balance to zero for each time repetition (TR) interval, which includes the step of causing the gradients with the controller to target three specific asymmetric regions in K space during each TR interval, where at least two of the regions overlap in K space and at least one region of K space is not imaged with the gradients during a given TR interval; and receiving an echo signal of the three specific asymmeteric regions with at least one receiving coil in communication with the controller which provides the echo signal to the controller for the controller to obtain the image, where data corresponding to the regions which overlap are time shifted such that corresponding k-space regions are removed from at least one data set and a series of data sets corresponding to each k-space region are inserted into a composite matrix without overlapping.

22. A method to form an image of a patient with an MRI comprising the steps of:

producing gradients with at least one emitting coil;

obtaining a steady-state image of the patient's accelerating tissue with a controller in communication with the emitting coil, where gradient areas balance to zero for each time repetition (TR) interval, which includes the step of causing the gradients with the controller to target three specific asymmetric regions in K space during each TR interval, where at least two of the regions overlap in K space and at least one region of K space is not imaged with the gradients during a given TR interval; and receiving an echo signal of the three specific asymmeteric regions with at least one receiving coil in communication with the controller which provides the echo signal to the controller for the controller to obtain the image, where data corresponding to the regions which overlap are time shifted such that corresponding k-space regions are removed from at least one data set and a series of data sets corresponding to each k-space region are inserted into a composite matrix without overlapping.

23. A method to form an image of a patient with an MRI comprising the steps of:

producing gradients with at least one emitting coil;

obtaining a steady-state image of the patient's fat and water features by altering the fat and water spin phases to produce contrast with a controller in communication with the emitting coil, where gradient areas balance to zero for each time repetition (TR) interval, which includes the step of causing the gradients with the controller to target three specific asymmetric regions in K space during each TR interval, where at least two of the regions overlap in K space and at least one region of K space is not imaged with the gradients during a given TR interval; and receiving an echo signal of the three specific asymmeteric regions with at least one receiving coil in communication with the controller which provides the echo signal to the controller for the controller to obtain the image, where data corresponding to the regions which overlap are time shifted such that corresponding k-space regions are removed from at least one data set and a series of data sets corresponding to each k-space region are inserted into a composite matrix without overlapping.

* * * * *